United States Patent [19]

Abrams et al.

[11] Patent Number: 4,624,740

[45] Date of Patent: Nov. 25, 1986

[54] TAILORING OF VIA-HOLE SIDEWALL SLOPE

[75] Inventors: Allan D. Abrams; Robert C. Bausmith; Karey L. Holland; Steven P. Holland, all of Essex Junction, Vt.

[73] Assignee: International Business Machines Corporation, Armonk, N.Y.

[21] Appl. No.: 693,698

[22] Filed: Jan. 22, 1985

[51] Int. Cl.$^4$ .................. H01L 21/312; B44C 1/22; C03C 25/06

[52] U.S. Cl. ............................. 156/643; 156/644; 156/655; 156/657; 156/659.1; 156/668; 204/192.32; 430/317

[58] Field of Search ............... 156/643, 644, 655, 657, 156/659.1, 653, 668; 430/317; 204/192 E; 252/79.1

[56] References Cited

U.S. PATENT DOCUMENTS

| | | | |
|---|---|---|---|
| 3,880,684 | 4/1975 | Abe | 252/79.1 X |
| 4,352,870 | 10/1982 | Howard et al. | 430/271 |
| 4,369,090 | 1/1983 | Wilson et al. | 156/668 X |
| 4,378,383 | 3/1983 | Moritz | 156/643 X |
| 4,431,478 | 2/1984 | Yamaoka et al. | 156/668 |
| 4,461,672 | 7/1984 | Musser | 156/643 X |
| 4,484,979 | 11/1984 | Stocker | 156/644 X |
| 4,487,652 | 12/1984 | Almgren | 156/668 X |
| 4,495,220 | 1/1985 | Wolf et al. | 204/192 EX |
| 4,523,976 | 6/1985 | Bukhman | 156/668 X |

FOREIGN PATENT DOCUMENTS

| | | |
|---|---|---|
| 2636351 | 2/1978 | Fed. Rep. of Germany . |
| 3225963 | 1/1984 | Fed. Rep. of Germany . |
| 1230421 | 5/1971 | United Kingdom . |

OTHER PUBLICATIONS

J. E. Hitchner et al, "Polyimide Layers having Tapered Via Holes," Sep. 1977, IBM Technical Disclosure Bulletin, vol. 20, No. 4, p. 1384.

Kelly et al, "Electro Chemical Aspects of the Beveling of Sputtered Permalloy Films", *J. Electrochem. Soc.: Electrochemical Science and Technology*, Jun. 1978, pp. 860–865.

Homma et al, "Polyimide Liftoff Technology for High-Density LSI Metallization", *IEEE Transactions on Electron Devices*, vol. ED-28, No. 5, May 1981, pp. 552–556.

Nishida et al, "Advanced Planar Metallization with Polymer for VLSI," *Proceedings of the IEEE-IEDM '82*, pp. 552–555.

Primary Examiner—David Simmons
Assistant Examiner—Ramon R. Hoch
Attorney, Agent, or Firm—Mark F. Chadurjian

[57] ABSTRACT

A method of selectively tailoring the slope of via hole sidewalls. A first polyimide layer (in which the vias are to be formed) is covered by a strippable layer, and the two layers are isotropically etched. By varying the thickness of the strippable layer with respect to that of the polyimide layer, the slope of the via hole sidewalls can be controlled.

11 Claims, 9 Drawing Figures

TAILORING OF VIA-HOLE SIDEWALL SLOPE

CROSS-REFERENCE TO RELATED APPLICATIONS

Reference is made to co-pending U.S. patent application by Liu, Ser. No. 576,991, entitled "Application Method For Controlled Via Hole Process", assigned to the assignee of the present invention. The application relates to a method of forming via holes having rounded sidewall profiles.

1. Technical Field

The invention relates to a method of forming vias in an insulator layer.

2. Background Art

The general idea of forming holes in an insulator layer formed atop an integrated circuit device is well known. These holes are filled with a conductive material which establishes electrical contact between the underlying device and an external signal source. More recently, multiple layers of these metallizations have been formed, using multiple layers of insulators to isolate the metallizations from one another except for preselected areas which are interconnected through the above-described vias.

A problem which has been addressed in the art is that of metal step coverage. If the slope of the sidewalls of the via holes is too great, the metal layer may not cover the "step" created by the via. Such a discontinuity can cause an open line condition, substantially degrading device performance. One way of addressing this problem is to reduce the sharp angle of the slope of the via hole sidewalls.

U.S. Pat. No. 3,880,684 (issued 4/29/75 to Abe and assigned to Mitsubishi) teaches a process for etching a dual dielectric structure (consisting of dielectric layers having different etching characteristics) using a non-erodible mask. The dielectric materials, as well as the relative positions of the layers, are preselected in order to produce the desired via profile.

U.S. Pat. No. 4,369,090 (issued 1/18/83 to Wilson et al and assigned to Texas Instruments) teaches a method for forming sloped vias in polyimide insulators by starting with a partially cured film and selectively exposing it to curing agents to develop the desired etching characteristics in the film.

U.S. Pat. No. 4,378,383 (issued 3/29/83 to Moritz and assigned to assignee of the invention) teaches a method for forming vias in an insulating layer. A masking layer is used having overhanging walls which erode during etching.

An article by J. J. Kelly et al, entitled "Electrochemical Aspects of the Beveling of Sputtered Permalloy Films", *Electrochemical Science and Technology*, June 1978, pp. 860-865, discusses the formation of a preselected edge profile in a base layer through the use of an upper layer having a greater etch rate.

SUMMARY OF THE INVENTION

It is an object of the present invention to provide an improved method of selectively tailoring the slope of the via hole sidewalls.

It is another object of the invention to provide a method of forming via holes in which the thickness of a layer overlaying the insulator layer controls the slope of the via sidewalls.

These and other objects of the invention are achieved by forming a removable sacrificial layer on an insulating layer formed on a substrate, the sacrificial layer having etching characteristics similar to those of the insulating layer. A non-erodible mask is formed on the sacrificial layer; the non-erodible mask having etching characteristics which differ from those of the sacrificial layer. The desired via hole pattern is then formed on the non-erodible mask, and the sacrificial and insulating layers are etched through the non-erodible mask to thereby form vias in the insulating layer. The slope of the via holes formed in the insulating layer is determined by the combined thickness of the insulating layer and the sacrificial layer.

BRIEF DESCRIPTION OF THE DRAWINGS

The above and other features will become more apparent upon a detailed description of the invention. In the description to follow, reference will be made to the accompanying drawing, in which.

BEST MODE FOR CARRYING OUT THE INVENTION

Figure 1A:
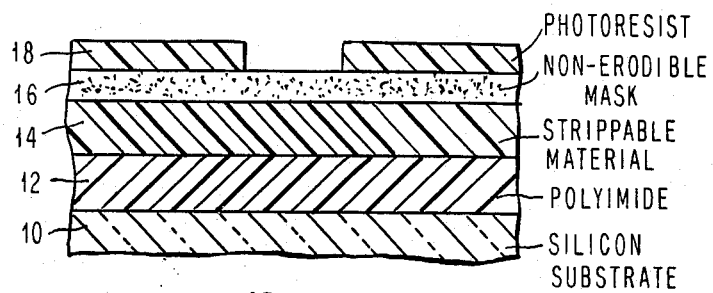
FIGS. 1A-1D are cross-sectional views of the deposition and etching of the layers utilized in the present invention.

The present invention will now be described with reference to FIGS. 1A-1D. FIG. 1A shows a cross section of the deposited layers prior to etching. A layer of polyimide 12 is formed by conventional techniques on a silicon substrate 10. The polyimide 12 is fully cured by subjecting the substrate to a baking step at 350° C. Note that the bare substrate 10 is given only by way of example; that is, the polyimide 12 can also be formed on a previously-deposited metallization layer, on a diffusion region, or any other structure present in conventional integrated circuits and the like.

A strippable layer 14 is then applied to the cured polyimide layer 12. Strippable layer 14 can consist of any material which can be stripped or otherwise removed without attacking the underlying polyimide 12. In addition, the etch rates of layer 14 and the polyimide 12 should be similar. One such material is partially cured polyimide (i.e. polyimide which is baked at approximately 120° C. for approximately 20 minutes). This material can be removed by an N-methyl pyrrolidinone (NMP) strip etch without appreciably etching the underlying polyimide. At the same time, the etch rates of the two polyimide layers are substantially similar. Another advantageous feature of uncured polyimide is that it does not reflow or otherwise deform during subsequent processing. As will be discussed in more detail below, the difference in the thicknesses of the two polyimide layers determines the slope of the sidewalls of the via produced in the polyimide layer 12.

Polyimide layer 14 is then coated with a mask layer 16. The mask layer 16 can be made of any material (such as silicon or spun-on glasses such as borosilicate glass or phosphosilicate glass) which does not etch (i.e. is "non-erodible") in an oxygen ($O_2$) plasma gas but which does etch in a tetrafluoromethane/oxygen ($CF_4$ and $O_2$) plasma gas. Preferably, the mask layer 16 is made up of silicon which is deposited using low temperature (less than 90° C.) vapor deposition techniques. The mask should be thin-approximately 50 nm thick. At this thickness, the silicon will be thick enough to eliminate pinhole formation, while still being thin enough to be transparent (facilitating mask alignment).

A layer of photoresist 18 is then coated onto the mask layer 16. The photoresist is masked, exposed and developed in KOH as per conventional techniques. Note that as an alternative to a silicon mask layer 16 and photoresist 18, a single layer of silicon-rich photoresist (having a low etch rate in an $O_2$ plasma) may be used. Such a photoresist may be formed by exposing a standard photoresist to a hardening solution such as HMDS. The photoresist will absorb the silicon present in these compounds, making the photoresist silicon-rich.

Figure 1B:
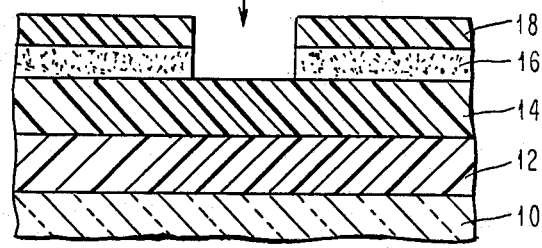

As shown in FIG. 1B, mask layer 16 is etched through the photoresist 18 in a $CF_4+O_2$ anisotropic plasma etch. The structure is etched for a time period sufficient to transfer the pattern formed in the photoresist to the mask layer 16. During this process, the underlying strippable layer 14 is not etched since the polyimide does not etch appreciably in $CF_4+O_2$ plasma.

Figure 1C:
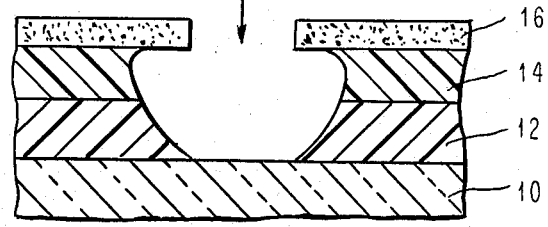

Then, as shown in FIG. 1C, the gas content of the etch gas is changed from $CF_4+O_2$ to pure $O_2$, such that the strippable layer 14 as well as the polyimide 12 are isotropically etched. The mask layer 16 protects the upper surface of the strippable layer 14 during this etching step. As the underlying layers are etched, the photoresist layer 18 is removed. This etch step can be completed using a plasma etch or a high pressure reactive ion etch.

Figure 2A:
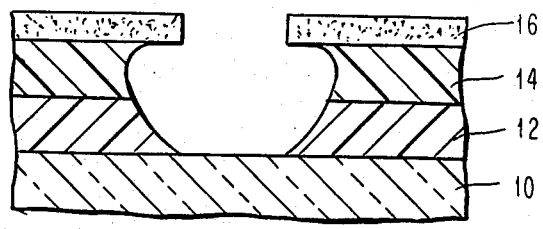
FIGS. 2A-2E are cross-sectional views which illustrate the variation in via hole sidewall slope as a function of the thickness of the sacrificial layer.

The profile of the apertures etched into the strippable layer 14 and the polyimide layer 12 is a function of the etch temperature, time, etc. It is the respective thicknesses of the two layers which yields the controllable slope of the sidewalls of the via holes etched into the polyimide layer 12. This feature is illustrated more fully in FIGS. 2A–2E. As shown in FIG. 2A, the slope of the sidewalls of the via hole is approximately 60° when the strippable layer 14 and the polyimide layer 12 are of the same thickness. The slope of the sidewall is given by $$\cos^{-1} \frac{\text{thickness of layer 14}}{\text{thickness of layer 14} + \text{thickness of layer 12}}$$

Figure 2B:
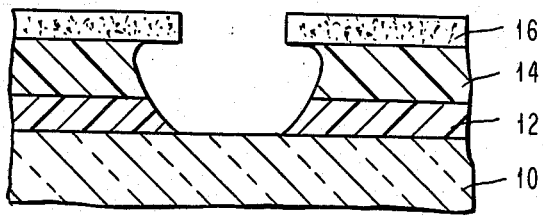
Figure 2C:
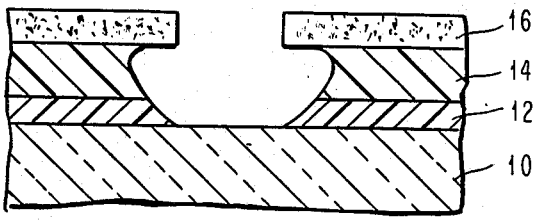
Figure 2D:
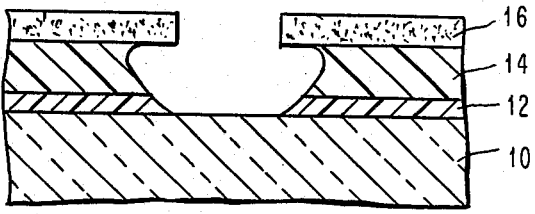
Figure 2E:
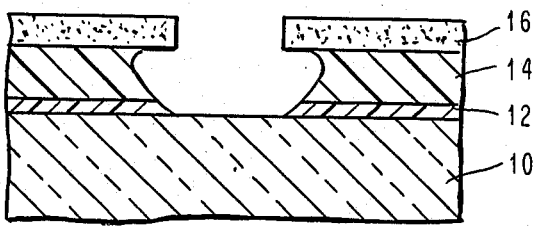

As shown in FIG. 2B, notice that the slope decreases to 53° when the thickness of the strippable layer 14 equals 1.5× the thickness of the polyimide layer 12. As shown in FIG. 2C, the angle decreases to 48° when this ratio is 2:1; as shown in FIG. 2D, the angle is 41° when this ratio is 3:1; and, as shown in FIG. 2E, the angle is 37° when this ratio is 4:1. For each of the examples shown in FIGS. 2A–2E, the overall profile of the aperture etched into layers 12 and 14 is the same. As the thickness of layer 14 increases with respect to layer 12, the sidewalls of the vias etched into polyimide layer 12 are defined to a greater extent by the bottom portion of the overall aperture profile. Thus, since the overall aperture profile has a decreasing slope at its bottom region, the via hole sidewall slope decreases as the thickness of layer 14 increases.

Figure 1D:

After the aperture is completely formed in layers 14 and 12, the plasma etch gas is changed from pure $O_2$ back to a $CF_4+O_2$ mixture, and the mask layer 16 is removed. Finally, as shown in FIG. 1D, the strippable layer is removed by wet etching in an N-methyl pyrrolidinone (NMP) solution, leaving the polyimide 12 with via holes having sidewalls of a predetermined slope. The via holes formed in the manner of the invention can be metallized using any one of the many known metallization processes. As previously mentioned, the strippable layer 16 consists of a material such as polyimide cured to 120° C. which can be removed by wet etch stripping without appreciably effecting the underlying polyimide 12. Prior to the NMP strip step, the strippable layer 14 can be exposed to a short oxygen plasma ash in order to remove any impurities. This step enhances the strippability of the strippable layer 14.

Thus, as described above, the inventors have proposed a method of selectively tailoring the sidewall slope of via holes formed in an insulating layer. The invention enables a process designer to select the most advantageous sidewall slope for the metallization pattern to be employed. It is to be noted that the concepts of the invention can be extended to a wide range of via hole formation and metallization techniques. For example, these concepts can be applied to a structure wherein a silicon oxide layer performs the function of polyimide layer 12, a silicon nitride layer performs the function of strippable layer 14, and a patterned aluminum layer performs the function of the non-erodible mask.

It is to be understood that various modifications to the structures and teachings of the invention as described above can be made without departing from the spirit and scope of the present invention.

What is claimed is:

1. A method of forming via holes with sidewalls having a predetermined slope in a first polyimide layer having a first thickness, comprising the steps of:
    forming a partially cured second polyimide layer of a second thickness on said first polyimide layer;
    forming a first mask layer on said second polyimide layer;
    etching apertures in said first mask layer by exposing photolithographically defined regions of said first mask layer to a first etchant which does not appreciably etch said second polyimide layer;
    isotropically etching apertures in both of said second polyimide layer and said first polyimide layer through said apertures in said first mask layer by exposure to an $O_2$ plasma which does not etch said first mask layer, said second polyimide layer and said first polyimide layer being etched at substantially the same rate, the slope of the sidewalls of the via holes etched in said first polyimide layer being a function of said thickness of the second polyimide layer with respect to said thickness of said first polyimide layer;
    removing said first mask layer by exposure to said first etchant; and
    removing said second polyimide layer by exposure to a wet etchant which does not appreciably etch said first polyimide layer.

2. The method as recited in claim 1, wherein said second polyimide layer is cured at approximately 120° C. for approximately 20 minutes.

3. The method as recited in claim 1, wherein said step of etching apertures in said first mask layer comprises the steps of:
    forming a second mask layer on said first mask layer;
    patterning said second mask layer to expose regions of said first mask layer; and
    etching said first mask layer through said second mask layer by exposure to a plasma gas comprised of tetrafluoromethane and oxygen.

4. The method as recited in claim 3, wherein said first mask layer is comprised of a silicon-rich photoresist.

5. The method as recited in claim 3, wherein said first mask layer comprises a thin layer of a transparent material.

6. The method as recited in claim 5, wherein said first mask layer is comprised of silicon.

7. The method as recited in claim 5, wherein said first mask layer is comprised of a compound selected from the group consisting of borosilicate glass and phosphosilicate glass.

8. The method as recited in claim 3, wherein said second mask layer is substantially removed during said isotropic etch of said second polyimide layer and said first polyimide layer.

9. The method as recited in claim 1, wherein said mask layer comprises a layer of silicon.

10. The method as recited in claim 1, wherein said wet etchant comprises N-methyl pyrrolidinone.

11. A method of forming vias having sidewalls of a controllable slope in a fully cured polyimide layer of a first thickness coated on a processed semiconductor substrate, comprising the steps of:

forming a partially cured polyimide layer of a second thickness on said fully cured polyimide layer;

forming a transparent masking material on said partially cured polyimide layer;

photolithographically defined openings in said transparent masking material by exposure to a $CF_4+O_2$ reactive ion etch which does not appreciably attack said partially cured polyimide layer;

isotropically etching said partially cured polyimide layer and said fully cured polyimide layer, through said openings in said transparent masking material, in an $O_2$, plasma etch that does not appreciably attack said transparent masking material, said partially cured and fully cured polyimide layers being etched at substantially the same rate, said isotropic etch forming vias in said fully cured polyimide layers having sidewalls of a slope determined as a function of said first and second thicknesses of said fully cured polyimide layer and said partially cured polyimide layer, respectively;

removing said transparent masking material in an etchant that does not appreciably attack said partially cured polyimide layer; and removing said partially cured polyimide layer by exposure to a wet etchant which does not appreciably attack said first polyimide layer.

* * * * *